United States Patent
Voisin et al.

[11] Patent Number: 5,680,191
[45] Date of Patent: Oct. 21, 1997

[54] DRIVER TABS LIQUID CRYSTAL DISPLAY HAVING MULTI-CONTACT

[75] Inventors: Paul A. Voisin, Walled Lake; Brian K. Bradford, III, Davisberg, both of Mich.

[73] Assignee: OIS Optical Imaging Systems, Inc., Troy, Mich.

[21] Appl. No.: 668,520

[22] Filed: Jun. 28, 1996

Related U.S. Application Data

[60] Continuation of Ser. No. 409,651, Mar. 24, 1995, abandoned, which is a division of Ser. No. 200,670, Feb. 23, 1994, Pat. No. 5,436,745.

[51] Int. Cl.$^6$ ................................................. G02F 1/1345
[52] U.S. Cl. ........................................... 349/150; 349/152
[58] Field of Search .................................... 359/88, 83, 87, 359/62; 257/662, 672; 349/150, 152

[56] References Cited

U.S. PATENT DOCUMENTS

| | | | |
|---|---|---|---|
| 4,431,270 | 2/1984 | Funada et al. | 350/332 |
| 4,474,432 | 10/1984 | Takamatsu et al. | 350/339 R |
| 4,545,647 | 10/1985 | Sasaki et al. | 350/331 R |
| 4,549,174 | 10/1985 | Funada et al. | 340/784 |
| 4,586,789 | 5/1986 | Kishimoto et al. | 350/336 |
| 4,623,222 | 11/1986 | Itoh et al. | 350/331 |
| 4,655,551 | 4/1987 | Washizuka et al. | 350/334 |
| 4,690,510 | 9/1987 | Takamatsu et al. | 350/334 |
| 4,710,680 | 12/1987 | Nakatani et al. | 315/169.4 |
| 4,772,100 | 9/1988 | Suenaga | 350/336 |
| 4,836,651 | 6/1989 | Anderson | 350/334 |
| 4,862,153 | 8/1989 | Nakatani et al. | 340/719 |
| 4,958,911 | 9/1990 | Beiswenger et al. | 350/331 R |
| 5,016,986 | 5/1991 | Kawashima et al. | 350/339 R |
| 5,029,984 | 7/1991 | Adachi et al. | 350/334 |
| 5,155,612 | 10/1992 | Adachi et al. | 359/80 |
| 5,168,384 | 12/1992 | Genba | 359/83 |
| 5,243,453 | 9/1993 | Kawaguchi et al. | 359/74 |
| 5,448,451 | 9/1995 | Takubo et al. | 361/749 |
| 5,450,221 | 9/1995 | Owen et al. | 359/83 |

FOREIGN PATENT DOCUMENTS

| | | | |
|---|---|---|---|
| 0567209 | 2/1993 | European Pat. Off. | H01L 23/498 |
| 59-152421 | 8/1984 | Japan | 359/87 |
| 59-210419 | 11/1984 | Japan | F09F 9/00 |
| 1-237591 | 9/1989 | Japan . | |
| 1-241591 | 9/1989 | Japan . | |
| 2074922 | 3/1990 | Japan | G02F 1/1333 |
| 3-17629 | 1/1991 | Japan . | |
| 4-106528 | 4/1992 | Japan . | |
| 5-188390 | 7/1993 | Japan . | |

OTHER PUBLICATIONS

"Meeting the Challenges of Flexible Circuits" by Jack Lexin, Jul. 1992.

*Primary Examiner*—William L. Sikes
*Assistant Examiner*—Charles Miller
*Attorney, Agent, or Firm*—Myers Liniak & Berenato

[57] ABSTRACT

An active matrix liquid crystal display assembly including a flex circuit for interfacing substantially all of the row and column address lines of the display panel with a display output controller. The flex circuit is preferably made of two planar sheets laminated to one another, the first flex circuit sheet interfacing the row address lines with the display output controller and the second sheet interfacing the column address lines of the active matrix with the controller. The flex circuit includes a plurality of extension members, each extension member being electrically adhered to a driver TAB mounted to a peripheral side of the display panel.

9 Claims, 11 Drawing Sheets

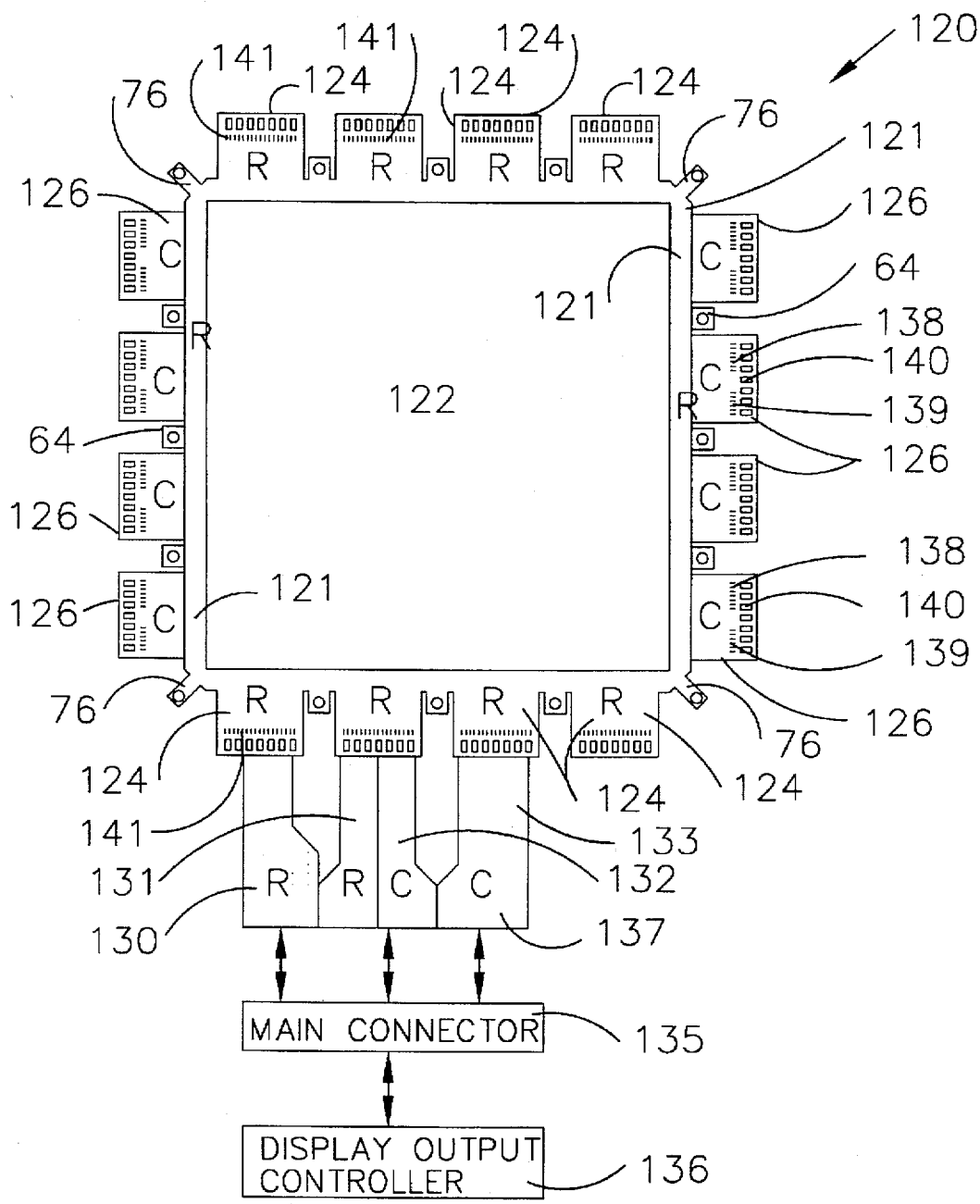

DRIVER TABS LIQUID CRYSTAL DISPLAY HAVING MULTI-CONTACT

This is a continuation of application Ser. No. 08/409,651, filed on Mar. 24, 1995, now abandoned which, is a division of Ser. No. 08/200,670, filed Feb. 23, 1994, now U.S. Pat. No. 5,436,745.

This invention relates to driving electronics for an active matrix liquid crystal display (AMLCD). More particularly, this invention relates to a flexible ring-shaped circuit board for interfacing all active matrix driver chips mounted to an AMLCD panel with a display output controller.

BACKGROUND OF THE INVENTION

Active matrix liquid crystal display devices are well-known throughout the art. For example, U.S. Pat. Nos. 4,855,724; 3,862,360; 4,112,333; and 4,762,398 disclose active matrix liquid crystal displays having row and column address lines and corresponding driving circuitry. This type of display is commonly known throughout the art as an "X-Y active matrix type LCD". In such displays, both the row and column address lines disposed in the display panel are generally interdigitated (one-half extending to one edge of the display panel and the other half to the opposite edge) so that the address lines can be driven from all four peripheral sides of the panel. Such displays have many applications including uses in air vehicle cockpits, AMLCD projectors, televisions, lap-top computer screens, etc.

Conventional packaging arrangements in X-Y active matrix LCDs include mounting the row and column address line driver chips on separate rigid printed circuit boards disposed adjacent the peripheral edges (i.e. sides) of the display panel and interfacing the driver chips with a central controller for controlling the output of the AMLCD, each edge of the display panel having a separate circuit board mounted adjacent thereto. This type of AMLCD assembly is disclosed, for example, in U.S. Pat. Nos. 4,772,100 and 5,155,612. In these displays, the address lines extending to a particular side of the display panel are interfaced with the circuit board corresponding to that side of the display panel. This, unfortunately, results in the need for up to four different circuit boards, one for each side of the display panel having exposed address lines. These circuit boards typically extend laterally with respect to the plane of the display panel and occupy valuable boarder space.

In aforesaid U.S. Pat. No. 4,772,100, the circuit boards are mounted below the display panel so as to conserve boarder space. This design, however, significantly increases the overall depth of the AMLCD assembly rendering it difficult to install in areas having strict depth requirements, such as avionic cockpits.

It is therefore desireable to mount the driver chips on the display panel via flexible circuit elements, to which the chips are attached. The flexible circuit elements are orthogonally bent around the peripheral edges of the panel to optimize space. The row and column address lines of the display panel are electrically connected to one end of the flexible circuits and thereafter interfaced with the central controller by way of the driver TABS, with a circuit board corresponding to each side of the display being disposed between the flexible circuit elements and the central controller. Unfortunately, these AMLCDs still require up to four different circuit boards to interface all of the display panel address lines with the controller.

U.S. Pat. No. 4,836,651 discloses such a flexible circuit assembly for an active matrix liquid crystal display. FIG. 1 is a perspective view of this prior art AMLCD (active matrix liquid crystal display) assembly including multi-layer flex circuits 11 and 14 interconnecting the row and column panel address lines (not shown) and the drivers 12 and 13 disposed on the flex circuits. For simplicity purposes of illustration, the housing in which the display panel, backlight, and associated circuitry are mounted is not shown in FIG. 1.

The prior art active matrix liquid crystal display panel of FIG. 1 is illustrated generally at 10 and typically includes of a pair of opposing transparent glass substrates sealed peripherally so as to define a planar cavity in which a liquid crystal layer is retained. The interior surface of one of the substrates has a transparent ground plane electrode (not shown), preferably of indium tin oxide (ITO), disposed thereon. Deposited on the interior surface of the other glass substrate is a pattern of individual transparent pixel electrodes (not shown) which define the X-Y matrix of individual liquid crystal cells. These cells form the array of liquid crystal picture elements or pixels. The individual pixels are separated by X and Y directed address lines so as to form a row and column arrangement with the address lines being interdigitated so that they may be driven from all four peripheral edges of the display.

Shown affixed to the front or viewing side planar surface of the display panel 10 and orthogonally bent around the panel peripheral edges are a plurality of multi-layer flex circuits 11 and 14 which support row drivers 12 and column drivers 13, respectively. The row and column drivers 12 and 13 supported on the multi-layer flex circuits 11 and 14 include hermetically sealed leadless chip carriers which contain driver chips (not shown).

One longitudinal end of each of the multi-layer flex circuits 11 and 14 is connected to the individual address lines (row or column) extending to the edge of the display panel 10. When the flex connectors are soldered to these address lines, the flex connectors are, as shown in FIG. 1, bent orthogonally relative to the plane of the liquid crystal display panel 10 thereby minimizing the circumferential boarder extent of the display assembly. However, the disposition of the drivers 12 and 13 at the ends of the flex circuits 11 and 14 significantly increases the depth of this AMLCD assembly.

In a typical 4×4 active matrix liquid crystal display having a line density of 100 lines per inch, each of the four sides of the display has 200 address lines driven therefrom. Thus, each of the flex circuits shown in FIG. 1 would drive 50 address lines. Flex circuits 11 and 14 are respectively connected to cascade circuit boards 15 and 16 and thence to multi-pin connectors 17 and 18 for energizing the driver circuits. The multi-pin main connectors 17 and 18 allow the driver chips and flex circuits affixed thereto to interface with a conventional central controller for selectively controlling the output of the display.

In a typical operation of the aforesaid prior art AMLCD, the central controller (not shown) outputs data signals for selectively energizing certain pixels of the active matrix array. The signals from the controller proceed through main connectors 17 and 18, and are input through the circuit boards 15 and 16 to the driver chips disposed in drivers 12 and 13. The driver chips then provide output signals through their respective flex circuits 12 and 13 to predetermined address lines for activating particular pixels in the matrix array.

While the driving circuitry of FIG. 1 reduces the overall peripheral size of the prior art AMLCD, the design is not without its drawbacks. The AMLCD requires four separate cascades 15 and 16 as well as separate flexes 11 and 14 to be mounted adjacent each of the four peripheral sides of the display panel 10. The presence of so many circuit elements significantly adds to the cost of manufacturing this AMLCD assembly. Furthermore, the disposition of the cascade circuit boards structurally between the drivers and the main connectors increases the depth of the display assembly. Also, each circuit board requires its own main connector (e.g. 17, 18) for the drive circuitry of each peripheral side to be interfaced with the central controller, thus increasing the cost and complexity of the assembly.

It is known to connect adjacent circuit boards to one another using flexible circuits. In other words, four different such circuits could be utilized in the AMLCD assembly of FIG. 1, each one connected between adjacent circuit boards. This, however, again requires four separate circuit boards and four separate flexes.

It is also known to wrap a flex circuit around the periphery of a display panel. See "Meeting the Challenges of Flexible Circuits," Printed Circuit Design, July, 1992. A significant drawback of such a design is that only a small number of conductive trace layers may be disposed on the flexible circuit due to the fact that the circuit is non-planar through its entirety and includes up to four 90 degree bends therein. Therefore, this type of design is only useful in very small displays where few traces are required for addressing the panel. The aforesaid flex circuit design thus cannot be used to address high resolution AMLCDs requiring an increased number of trace layers due to its wrap-around design which significantly limits the number of traces (e.g. copper) which may be disposed at the corner or bend areas of the circuit.

Another known manner in which to reduce the overall size of AMLCD assemblies involves attaching individual driver TABS (TAB=tape automated bonding; hereinafter "tab") along each of the four peripheral sides of an AMLCD panel and providing a separate rigid circuit board adjacent each side of the display. Each such circuit board thus interfaces the central controller with the driver TABS mounted along the corresponding side of the display panel.

FIG. 2 illustrates such a driver TAB which was offered for sale more than one year before the filing date of this application. This TAB is typically mounted along an edge of an active matrix display panel so that the address lines of the active matrix panel are electrically connected (e.g. soldered) to the output leads 29 of driver TAB 20. Window 25 in base portion 21 is provided so that output lead support 32 may be mounted to the viewer side planar surface of the display panel and base portion 21 can be bent orthogonally (i.e. about 90°) with respect thereto around the peripheral edge or side of the panel. Therefore, the portions 28 of output traces 29 crossing window 25 are bent about 90° so that base 21 extends orthogonally from the rear planar surface of the display panel. The input traces 31 of tab 20 are interfaced with the central display output controller (not shown) by way of input contacts 34 (i.e. leads) defining the driver TAB input contact row or input pad.

Driver TAB 20 includes a uni-layer base portion 21, preferably made of a polyimide, upon which the plurality of copper input and output traces 31 and 29 are disposed, preferably by etching. Base portion 21 defines a horizontally aligned contact row window 23 over which input traces 31 cross to create the input contact row. A driver chip or die 27 is affixed by way of gold welds to the input and output traces disposed on base portion 21. After chip 27 is gold-welded, it is encapsulated so as to seal the gold welds along with the chip itself. TAB input traces 31 electrically interface the driver chip or die 27 with the central display output controller. Tooling holes 33 are defined by the base portion 21 so as to allow the driver tab 20 to be securely aligned and mounted during its manufacturing and trimming processes.

Typically, input signals for selectively controlling the activation of individual pixels in the matrix array originate at the central display output controller and make their way to driver chip 27 by way of the input contact row (i.e. input pad) 34. The input signals proceed from input pad 34 to driver chip 27 via input traces 31, the chip in turn dictating the output signals sent to the display panel through output leads 29. The output contact row 29 disposed on portion 32 electrically interfaces driver chip 27 with the display panel address lines. Accordingly, each of the output leads 29 is connected to either a row or column address line of the active matrix by conventional means thereby enabling the output of the display panel to be controlled by the signals sent from the central controller.

It is to be noted that certain input contacts (e.g. 35 and 36) are common leads which do not interface with driver chip 27. These leads are, for example, connected to the common plane of the display panel or may represent conventional replacement leads.

As will be appreciated by those of skill in the art, the aforesaid prior art driver TAB can only accommodate a predetermined number of input and output leads dictated by the overall width of base portion 21 (or longitudinal length of the input contact row). If more such leads are required to interface the display output controller with the address lines of the active matrix display panel, more such driver TABS must be used or the overall size of the TABS must be increased. Additional leads/traces cannot be disposed on the base portion 21 of driver TAB 20 because the pitch between the contacts must remain large enough so as to enable good electrical connection via soldering or welding between the input contacts (i.e. leads) of driver TAB 20 and their corresponding connecting lines.

It is known to provide such TABS with two vertical input contact rows (input pads) thus allowing the TAB to mount more leads, the term "vertical" meaning that the longitudinal axis of each such row is substantially perpendicular to the plane of the display panel. This, however, significantly increases the depth (or height) of the tab which in turn adds to the overall depth of the display assembly.

Accordingly, it would satisfy a long felt need in the art if a driver TAB having dimensions substantially similar to driver TAB 20 could be designed to accommodate significantly more input and output leads without significantly decreasing the pitch of the contacts in each row or pad, thereby enabling more AMLCD address It is apparent from the above that there exists a need in the art for a high resolution active matrix liquid crystal display assembly of the X-Y matrix type where all of the address lines of the display panel are interfaced to the display output controller by a single flex circuit thereby eliminating the need for multiple circuit boards, connectors, and flexes. Such a flex circuit should be able to accomodate an unlimited number of conductive trace layers so as to be able to address AMLCDs of varying resolutions. There also exists a need in the art for a driver TAB which can drive an increased number of AMLCD address lines without increasing the size of the display assembly.

SUMMARY OF THE INVENTION

Generally speaking this invention fulfills the above described needs in the art by providing an active matrix liquid crystal display assembly comprising:

a planar four-sided active matrix display panel including a plurality of row and column address lines for driving a matrix array of pixels, each pixel including a liquid crystal layer and means for applying a voltage thereto; and a flex circuit for electrically interfacing substantially all of the row and column address lines with a display output controller, the flex circuit being ring-shaped and disposed adjacent each of the four with a display output controller, the flex circuit being ring-shaped and disposed adjacent each of the four peripheral sides of the planar display panel, and wherein the flex circuit includes a planar ring portion having a plurality of conductive traces disposed thereon, the ring portion defining a plane substantially parallel to the plane defined by the planar display panel.

In certain preferred embodiments of this invention, the ring portion is mounted adjacent each of said four peripheral sides of the display panel, the flex circuit defining a viewing area of the panel through which light is selectively allowed to pass.

In certain further preferred embodiments of this invention, the flex circuit further includes a plurality of extension members connected to the ring portion, the extension members being electrically connected to a corresponding plurality of driver TABS mounted on two of the four peripheral sides of the display panel, and wherein the display panel defines a first plane and the extension members define a plurality of planes each substantially perpendicular to the first plane, and the driver TABS have driver chips affixed thereto and are attached to the planar display panel, the TABS also defining planes substantially perpendicular to the first plane.

In still other preferred embodiments of this invention, the planar ring portion is mounted on the rear planar surface of the display panel so as to define a plane substantially parallel to the first plane In other preferred embodiments of this invention, one of the extension members includes a tail portion extending therefrom, the tail portion being affixed to a main connector which electrically interfaces the flex circuit with the display output controller.

In still further preferred embodiments of this invention, the display further includes an extension receiver housing mounted to the rear of the display panel for slidably receiving substantially all of the extension members of the flex circuit, and wherein the extension receiver housing is ring-shaped and includes a plurality of receiving portions, each receiving portion having two grooves defined therein for receiving opposing edges of one of the extension members.

This invention further fulfills the above-described needs in the art by providing an active matrix liquid crystal display assembly comprising:

a substantially flat display panel including a matrix array of pixels, a liquid crystal layer, and row and column addressing lines for driving the pixels;

a plurality of driver TABS, each driver TAB having a driver chip and corresponding input and output leads disposed thereon, said driver TABS being affixed to the flat display panel adjacent at least two peripheral sides thereof; and a flex circuit for electrically interfacing all of the driver chips with a display output controller for controlling the output of the display panel, wherein the flex circuit is ring-shaped and is directly connected to all of the driver TABS, the flex circuit electrically interfacing substantially all of the driver chips to the display output controller via at least one main connector.

This invention further fulfills the above-described needs in the art by providing a driver TAB adapted to be affixed to a liquid crystal display panel, the driver TAB comprising:

a base portion having first, second, and third input contact row windows defined therein, the input contact row windows extending substantially parallel to a plane defined by the display panel;

a driver chip or die mounted thereon for controlling the output data of a plurality of conductive output leads, the driver chip and the output leads being disposed on the base portion;

a plurality of input leads defining first, second, and third input contact rows, each of the contact rows including a plurality of contacts disposed on the base portion and crossing over the first, second, and third input contact row windows respectively, the first and second contact rows being substantially parallel to one another, the first contact row having a greater number of contacts than the second contact row; and wherein at least some of the contacts of each of the first, second, and third input contact rows are adapted to interface the driver chip or die with a display output controller.

In certain further preferred embodiments of this invention, the first and third contact rows are substantially parallel to one another, the second and third contact rows defining an elongated axis which is substantially parallel to the first contact row, the second and third contact rows being located on the base portion between the first contact row and the die or driver chip, and wherein a plurality of the input leads on said base portion electrically connecting said die or driver chip and the first contact row are disposed and pass between the second and third contact rows, and wherein the driver TAB further comprises a fourth contact row, the fourth contact row being an output contact row including a plurality of output contacts to be electrically connected to address lines of the display panel.

This invention will now be described with respect to certain embodiments thereof, accompanied by certain illustrations wherein:

IN THE DRAWINGS

FIG. 6 is a top view of the flex circuit of a third embodiment of this invention, before the extensions are orthogonally bent relative to the ring portion.

FIG. 7 is a partial side view of the flex circuit of the embodiments of this invention illustrated by FIGS. 3–6, before the extensions are orthogonally bent relative to the ring portion.

DETAILED DESCRIPTION OF CERTAIN EMBODIMENTS OF THIS INVENTION

Referring now more particularly to the accompanying drawings in which like numerals indicate like parts throughout the several views.

Figure 1:
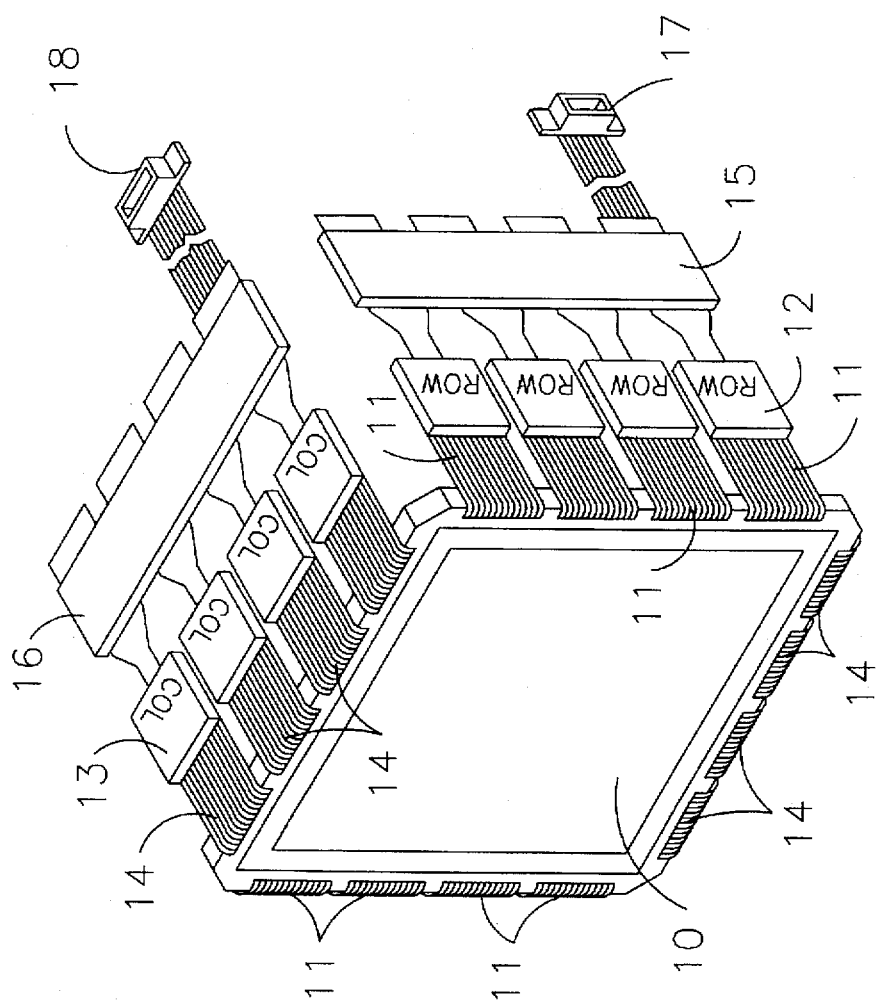
FIG. 1 is a perspective view of a prior art active matrix liquid crystal display assembly including flexible driving circuitry mounted thereon.
Figure 2:
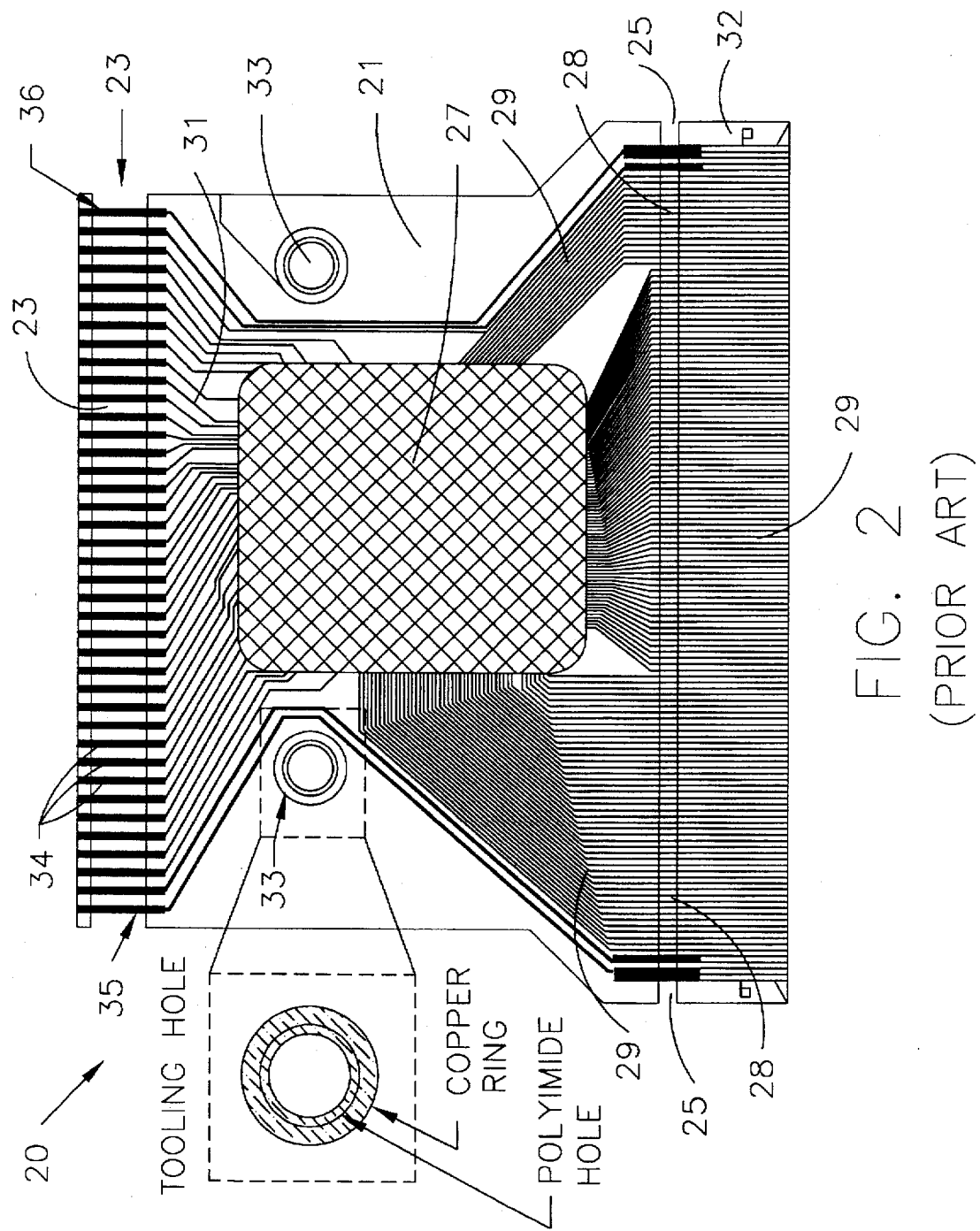
FIG. 2 is a front elevational view of a prior art driver tab before base portion 21 is orthogonally bent with respect to output lead support 32, including in dotted lines for illustrative purposes, a close-up view of a tooling hole defined therein.
Figure 3:
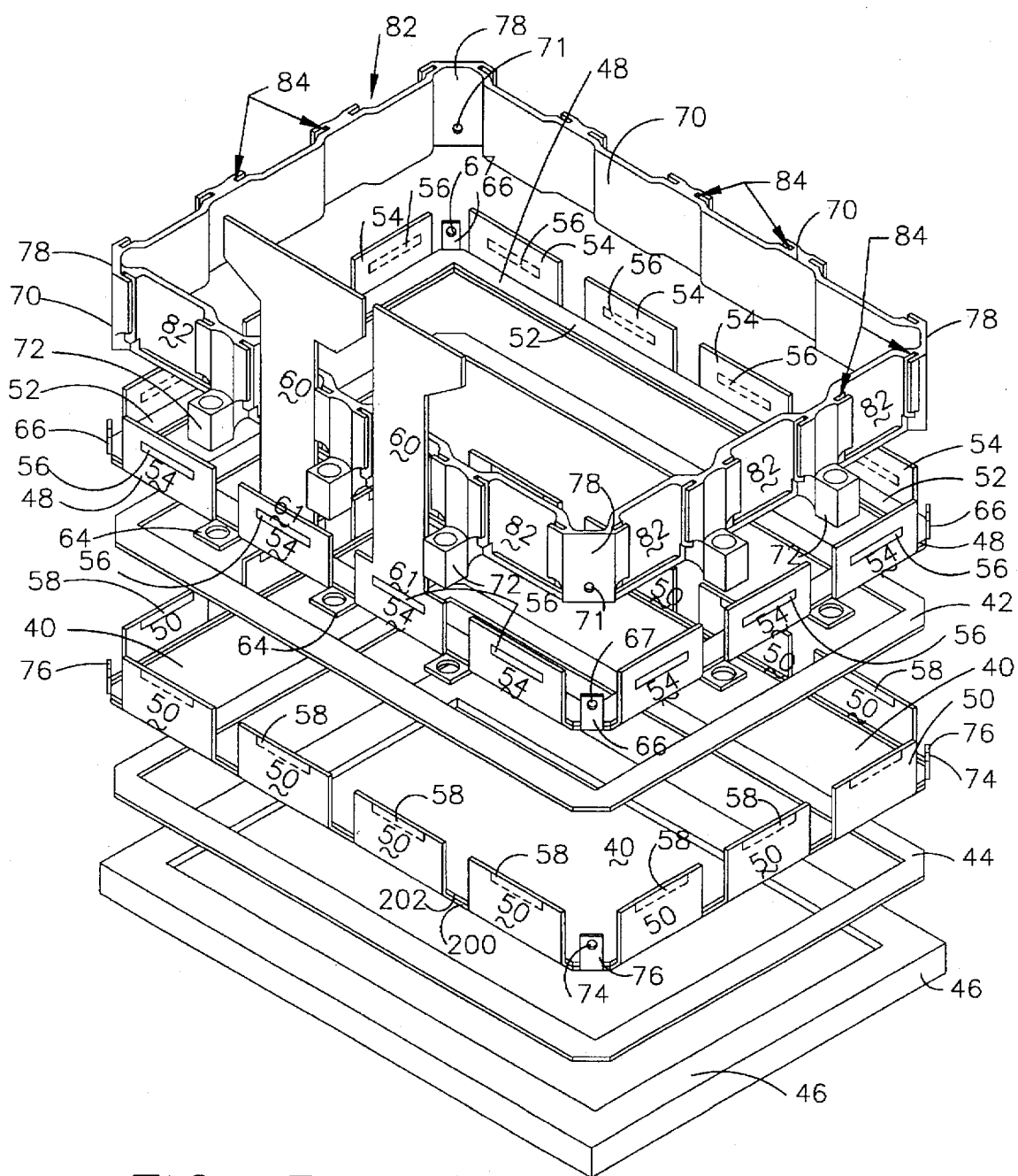
FIG. 3 is an exploded perspective view of an AMLCD assembly according to a first embodiment of this invention illustrating the layered arrangement of the display panel, flex circuit, and extension receiver housing.
Figure 4:
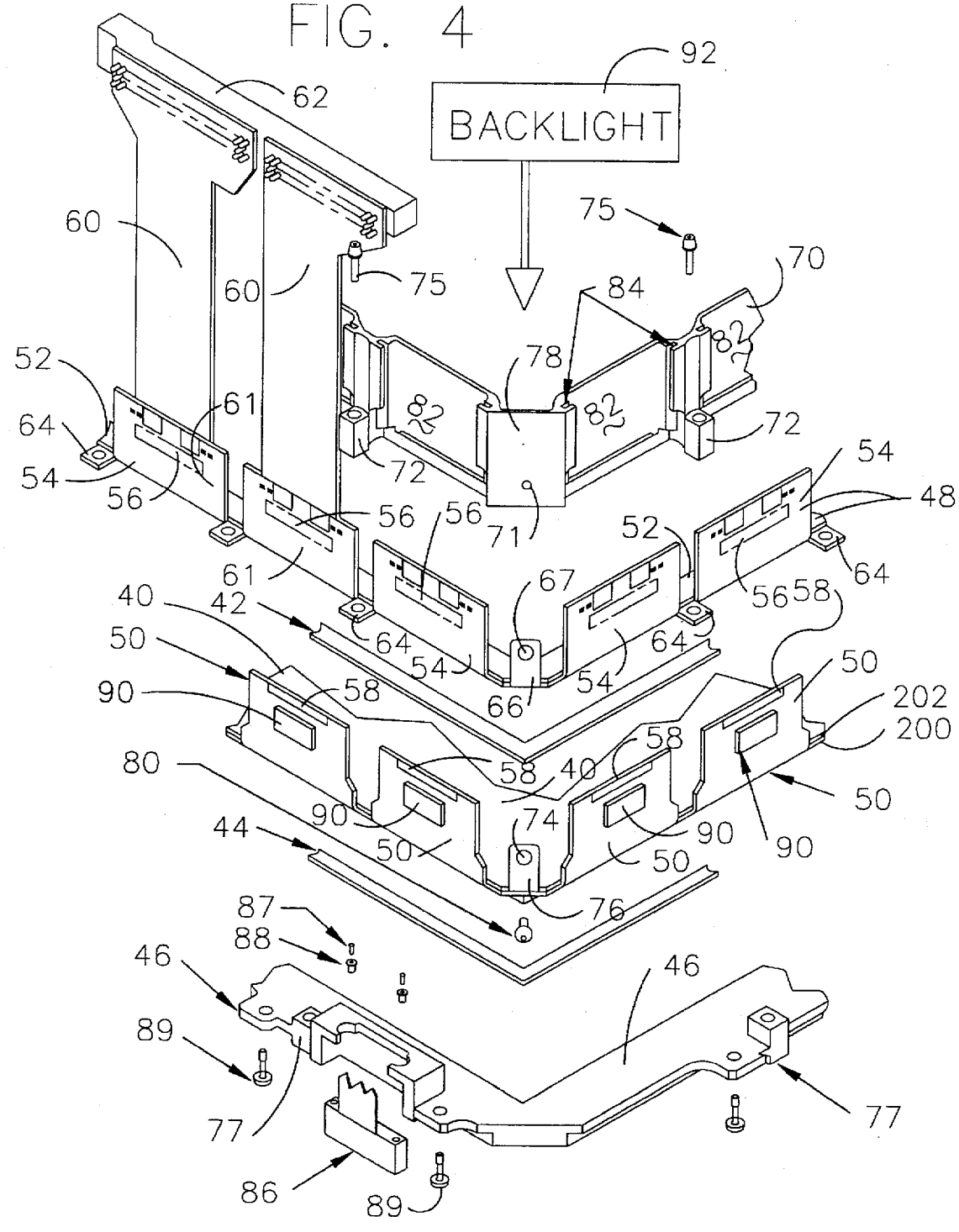
FIG. 4 is an exploded perspective view illustrating one corner of the embodiment of FIG. 3.

FIGS. 3-4 are exploded perspective views of an AMLCD assembly according to a first embodiment of this invention. A planar active matrix liquid crystal display panel 40 including a matrix array of pixels is disposed between panel gaskets 42 and 44. The display panel 40 includes transparent first and second substrates 200 and 202 (see FIG. 4) sandwiching a liquid crystal layer therebetween. The plurality of pixels (see FIG. 10) disposed in panel 40 each have opposing electrodes on opposite sides of the liquid crystal material. The opposing electrodes of each pixel are selectively energized so as to apply a voltage across the liquid crystal material. Typical pixel constructions for the active matrix display panel 40 are disclosed, for example, in U.S. Pat. Nos. 5,237,437, 4,632,514, and 5,003,356, the disclosures of which are hereby incorporated herein by reference. However, any type of known pixel construction can be used in accordance with this invention, preferably with the liquid crystal layer thickness provided so as to meet/match the first transmission minimum, as taught by Gooch-Tarry.

Display panel 40 includes a plurality of row and column address lines (not shown) for selectively activating the individual pixels. The address lines are not shown in FIGS. 3-4 for purposes of simplicity, but are illustrated in and described later with reference to FIG. 10. Furthermore, for purposes of simplicity of illustration, display panel 40 is shown in FIG. 3 as being completely transparent. In reality, this is not the case as is discussed in the aforesaid patents and illustrated in FIG. 4.

Typical row and column address lines and corresponding pixels disposed in panel 40 are described, for example, in U.S. Pat. Nos. 4,728,802, 5,003,356, and 5,193,018, the disclosures of which are hereby incorporated herein by reference. The aforesaid patents also describe conventional active matrix driving circuitry disposed in the panel, such as conventional switching TFTs, which may be used to selectively apply the voltage across the liquid crystal material of each pixel in accordance with commands generated by a display output controller (not shown).

A retainer bracket 46 is mounted on the viewer side of display panel 40 with gasket 44 disposed between the display panel 40 and retainer bracket 46. The inner peripheries of gasket 44 and bracket 46 define a viewing area of panel 40 through which light emitted from a conventional backlight (not shown) is selectively permitted to pass. The retainer bracket 46 protects the active matrix liquid crystal display assembly from the outer environment and is the element of the display assembly closest to the viewer.

Display panel 40 has a plurality of driver TABS 50 mounted thereto, each of which includes a plurality of conductive output traces disposed thereon to be electrically connected to the row and column address lines of AMLCD panel 40. The panel 40 of this embodiment has fourteen separate and distinct driver TABS 50 mounted thereto, four along each of two opposing peripheral sides, and three mounted along the other two peripheral sides. Each driver TAB 50 is preferably connected to approximately one to two hundred row or column address lines disposed in display panel 40.

The row and column address lines of panel 40 are both preferably interdigitated in that they extend laterally to opposing peripheral edges or sides of the display panel 40 where they are electrically connected to output contacts (not shown) of driver TABS 50. Exemplary driver TABS are more fully illustrated and described in FIGS. 11 and 12 which will be discussed below.

The ring-shaped flex circuit 48 is mounted along the periphery of the interior or rear planar surface of display panel 40 with the gasket 42 disposed therebetween. The purpose of flex circuit 48 is to interface all row and column address lines disposed in display panel 40 with a conventional central display output controller (not shown) which selectively controls the image output by the AMLCD panel pixels.

The flex circuit 48 of this embodiment is composed of two separate planer sheets laminated together (see FIG. 7). One of the planar sheets has conductive traces disposed thereon which are to be electrically interfaced with the row address lines, and the other planar sheet includes similar traces which are to be electrically interfaced with the column address lines, both by way of driver TABS 50.

Flex circuit 48 includes a ring or annular portion 52 which defines a plane substantially parallel to the plane of display panel 40. The ring portion 52 of flex circuit 48 is mounted adjacent all four peripheral sides of display panel 40 and defines a viewing area through which light from a backlight source (not shown) is selectively permitted to pass in order that it may be viewed by a viewer. The flex circuit 48 also includes a plurality of extension members 54 which extend orthogonally with respect to ring portion 52. The ring and extension portions 52 and 54 are originally formed as a planar sheet, with the extensions 54 thereafter being orthogonally (i.e. about 90°) bent with respect to ring portion 52. The planar nature of ring portion 52 allows an increased (substantially unlimited) number of conductive trace layers to be stacked thereon thus enabling the flex circuit to address AMLCDs of various resolutions.

Each flexible extension member 54 has an output contact area 56 disposed on its exterior surface for interfacing with input contact areas 58 disposed on driver TABS 50. The conductive input traces (not shown) disposed on driver TABS 50 are electrically connected to the conductive output traces (not shown) of flex circuit 48 by way of electrical connection between contact areas or pads 56 and 58 on each extension member 54 and corresponding driver TAB 50, respectively. Each extension member 54 has a plurality of conductive output traces thereon extending from the contact area 56 to ring portion 52. The ring portion 52 of flex circuit 48 is essentially a conductive trace highway having a plurality of copper traces disposed thereon, preferably in a plurality of layers (e.g. six to eight), which extend from the different extension members 54 to tail connectors 60.

Flex circuit 48 includes two sheets laminated together, each sheet having a base layer of Kapton (i.e. a dielectric), a polyimide, upon which a layer of rolled annealed copper (Cu) is disposed. The copper is chemically etched to form a plurality of copper traces on the base Kapton layer. A conventional acrylic or epoxy adhesive is layered on the aforesaid first copper trace layer. Thereafter, a second Kapton layer (i.e. cover layer) is disposed on the flex circuit sheet, the second Kapton layer for mounting a second layer of copper conductive traces. Up to about 18 or more of these trace layers (Cu traces with Kapton supports) may be laminated onto each flex circuit sheet in such a manner. After all of the copper trace layers have been deposited, a polyimide cover layer is adhered via a known epoxy or acrylic adhesive to the top of the layered flex circuit sheet, the cover layer defining apertures therein at locations corresponding to the flex circuit output pads. The exposed copper traces/leads within these apertures are covered, for example, with nickel (Ni) and gold, or solder plating in a conventional manner.

Tail connectors 60 extend outwardly (i.e. away from the display panel) from two extension members 61 in this embodiment so as to allow the conductive traces disposed on flex circuit 48 to be interfaced with the display output controller by way of main connector 62 mounted to the outward longitudinal ends of tail connectors 60. Preferably, one of the tail connectors 60 has all of the row address line conductive traces disposed thereon, while the other tail connector 60 supports conductive traces interfacing with all of the column address lines of the AMLCD panel.

The tail 60 including the row traces is, of course, integrally formed with the flex circuit sheet having the row circuitry thereon, while the other tail 60 (i.e. column tail 60) is integrally formed with the column sheet. The two sheets, as discussed above, are then laminated together so as to form flex circuit 48. The longitudinal end of each tail connector 60 disposed furthest away from flex circuit 48 is connected to main connector 62 which is electrically disposed between the display output controller and tail connectors 60.

Each flex circuit sheet preferably includes a fiberglass stiffening member adhered to both the ring portion and the extensions of that sheet. The junctions between the extensions and the ring portion are preferably free of stiffeners to allow the extensions to be bent orthogonally (i.e. about 90°) with respect to the ring portion. The two fiberglasses preferably used as stiffeners are known in the art as FR4 and G10. The shapes of the stiffening members roughly correspond to the size and peripheries of the ring and extension portions of the flex circuit sheets.

Figure 8:
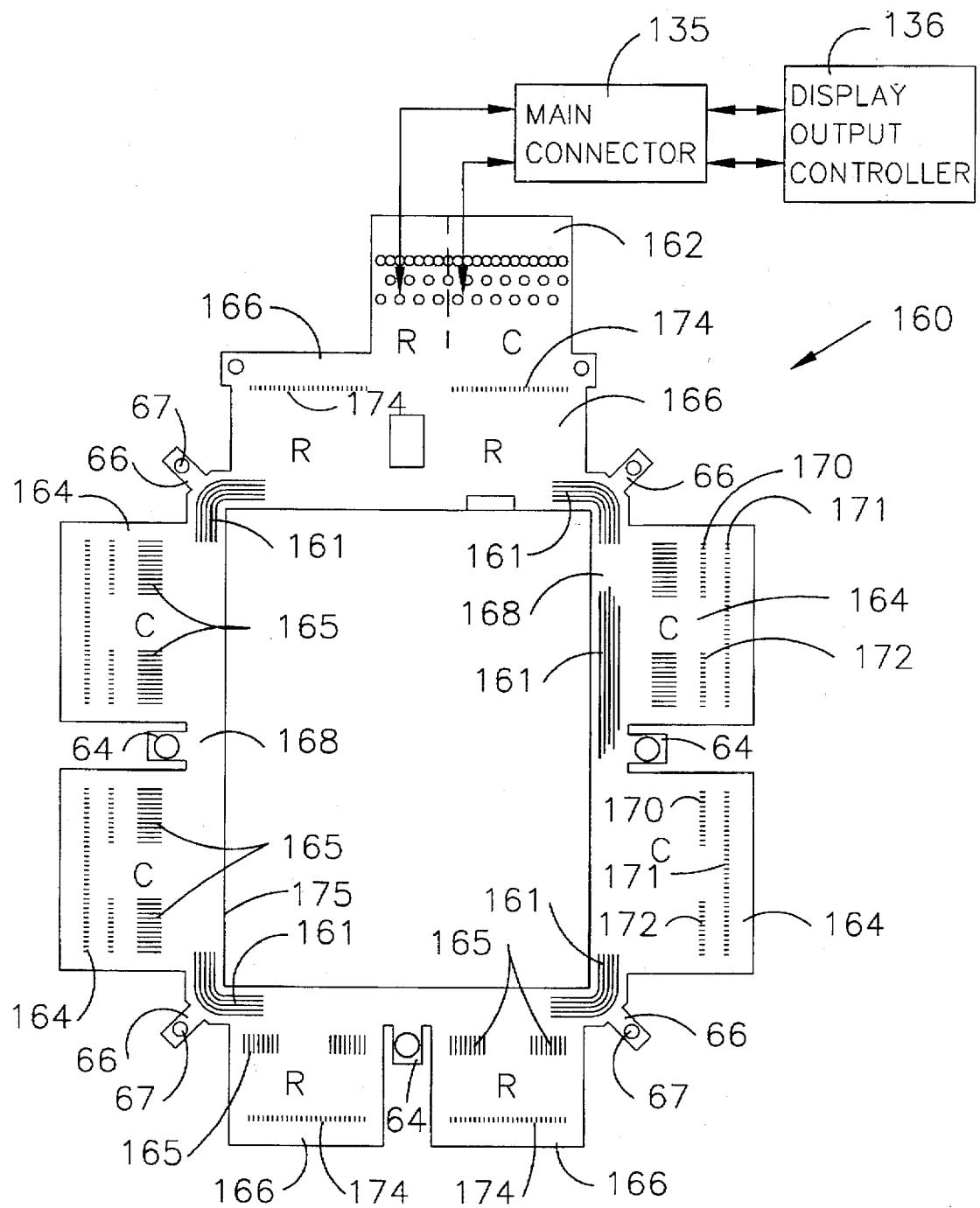
FIG. 8 is a top view of the flex circuit of a fourth embodiment of this invention, before the extensions are orthogonally bent relative to the ring portion.

While the conductive copper traces disposed on ring portion 52 of the flex circuit 48 are not shown in FIGS. 3–4 for purposes of simplicity, they extend longitudinally along all four sides of ring portion 52 and are connected between adjacent sides via the four corners of ring portion 52 as shown, for example, in FIG. 8 by reference numeral 161.

Flex circuit 48 includes a plurality of mounting tangs 64 extending radially outward from ring portion 52 so as to allow the flex circuit 48 to be compression mounted on display panel 40 between the retainer housing 46 and extension receiver housing 70. The tangs 64 extending from ring portion 52 are sandwiched between mounting members 72 and 77 (see FIG. 4) disposed on the extension receiver housing 70 and retainer housing 46 respectively. Screws or fasteners 75 extend through and connect mounting members 72, tangs 64, and mounting members 77 thereby compression mounting the retainer housing 46, gasket 44, display panel 40, gasket 42, flex circuit 48, and extension receiver housing 70. The compression between the aforesaid elements created by fasteners 75 creates a stable and efficient unit made up of the aforesaid AMLCD assembly elements. A second function of fasteners or screws 75 and tangs 64 is to provide grounding points disposed between the flex circuit extension members 54 in order to meet EMI grounding requirements.

The flex circuit 48 of this embodiment further includes four corner tangs 66 integrally formed with and extending orthogonally with respect to ring portion 52 at each of the four corners of flex circuit 48. Tangs 66 may be integrally formed with either the row sheet or the column sheet. Corner tangs 66 allow the corners of flex circuit 48 to be affixed to the four corners of both extension receiver housing 70 and display panel 40 via screw or fastener apertures 71 and 74 defined in the receiver housing 70 and display panel 40 respectively. Apertures 74 are connected to display panel 40 by panel corner tangs 76 extending orthogonally away from the planer surface of the display panel 40 at each of the four corners thereof.

Corner tangs 76 are preferably made of a single polyimide (e.g. Kapton) layer with copper traces chemically etched thereon. Two of the four corner tangs 76 are integral extension portions of heater buss bars, each buss bar being adhered to an ITO layer formed on a transparent glass substrate wherein the ITO heating layer is disposed immediately adjacent the exterior surface of a display panel polarizer. The ITO layer is heated/powered by current passed through the buss bars by way of tangs 76 and 66. Alternatively, only two tangs 76 could be used (instead of four), each being an integral part of a heater buss bar.

Apertures 71 of CNC-milled extension receiver housing 70 are defined in beveled corner areas 78 of the receiver housing 70. Beveled corner areas 78 (and corresponding beveled corners of the display panel, flex circuit, and retainer housing) reduce the overall size of the AMLCD assembly and allow the assembly to be mounted in tight fit places. Mounting screws 80 (see FIG. 4) fit through apertures 74, 67, and 71 in the corner mounting areas of display panel 40, flex circuit 48, and receiver housing 70, respectively, thereby providing a stabilized mounting at the corner areas of the aforesaid elements. Like tangs 64, corner tangs 66 of flex circuit 48 also act as grounding points.

Extension receiver housing 70 includes a plurality of receiving portions 82 which slidably receive each of the extension members 54 of flex circuit 48. Each receiving portion 82 receives a corresponding extension member 54 in opposing grooves 84 disposed on either side of the receiver portion 82. The lateral edges of extension members 54 slidingly fit into the opposing grooves 84 defined by the receiving portions 82, thereby sustaining the orthogonal relation of extensions 54 relative to ring portion 52. As shown, grooves 84 and receiving portions 82 are preferably formed in the exterior surface of receiver housing 70. After extensions have been received in grooves 84, driver TABS 50 are bent orthogonally with respect to display panel 40 and are connected to extensions 54 via gold welds or solder joints at output pads 56. In other words, the lateral edges of driver TABS 50 preferably are not received in grooves 84, and the output pads 56 of extensions 54 are welded or soldered to input pads 58 of TABS 50. Because driver TABS 50 are not received in grooves 84, the width of each TAB 50 is slightly less than the width of each corresponding extension 54.

Alternatively, although not preferred, the lateral edges of driver TABS 50 could be dimensioned so as to slidingly fit into receiving grooves 84.

In this embodiment, because active matrix display panel 40 is provided with 14 separate driver TABS (four on two sides and three on the other two sides), flex circuit 48 is provided with fourteen corresponding extension members 54 for electrical connection to driver TABS 50 while aluminum receiver housing 70 is accordingly provided with fourteen separate receiving portions 82 for slidably receiving extension members 54.

The receiving grooves 84 defined in receiver housing 70 eliminate the prior art need for expensive mounting hardware such as screws, bolts, etc. and simplify the mounting of the flexible driver TABS 50 and extension members 54.

The CNC-milled receiver housing 70, preferably made of aluminum, is mounted on the interior or rear planar surface of ring portion 52 thereby compressing flex circuit 48 and the display panel 40 between retainer housing 46 and extension receiving housing 70.

The beveled corner areas of receiver housing 70, flex circuit 48, and display panel 40 allow the AMLCD assembly of this embodiment to be mounted in boxes having chamfered edges. Such boxes are often present in cockpits of air vehicles. As a result of the design of this AMLCD assembly, cockpit mounted displays (not having beveled corner areas) in such boxes can be replaced with larger and higher resolution displays in accordance with this invention.

The retainer housing 46, disposed on the exterior or front side of display panel 40, protects the viewer side of the display and defines the viewing area thereof. As shown in FIG. 4, the AMLCD assembly cable bezel 86 supplies signals to a keypad disposed, for example, in the cockpit of an aircraft, so that the pilot can interface with the electronics of the AMLCD. Cable bezel 86 is mounted via retaining fasteners 87 and 88, while retainer housing 46 is mounted by way of fasteners 89 to a chamfered corner box (not shown) which houses the entire AMLCD assembly.

FIG. 4 illustrates a driver chip or die 90 mounted on each driver TAB 50. The purpose of flex circuit 48 is to provide power to the plurality of driver chips 90 mounted around the perimeter of display panel 40. Each driver chip 90 or die is preferably made of silicon and includes layer upon layer of electronics in a microminiature scale. Conductive input leads (see FIGS. 11 and 12) disposed on driver tabs 50 electrically connect driver chips 90 to input contact rows or pads 58 which are to be interfaced with output contact pads 56 disposed on extension members 54. The input contact pad 58 of each driver TAB serves as an input for allowing signals from the display output controller (not shown) to reach driver chip 90. Each driver TAB 50 has an output pad or contact row disposed thereon which is bonded to the display panel 40 for electrical connection between the address lines of AMLCD panel 40 and the output leads of the driver TAB.

In a typical operation of the AMLCD assembly of this embodiment, the conventional display output controller (not shown, see FIGS. 6, 8 and 9) generates a signal for selectively controlling the energization of various pixels in display panel 40. The controller output signal, having row address line data and column address line data, is transmitted to the main connector 62. The signals relating to the row address lines of the display panel are directed from the main connector 62 down one of the tail connectors 60 while the data relating to the column address lines of AMLCD panel 40 are transmitted through the other tail connector 60. Accordingly, one tail connector 60 inputs all row address line data into flex circuit 48 while the other tail 60 inputs all column signals to the conductive copper traces of flex circuit 48. This data is transmitted through the tail connectors 60 to layers of conductive traces (not shown) disposed on ring portion 52 of the flex circuit. The conductive traces on the ring portion 52 of flex circuit 48 are preferably made of copper and may include approximately one to eighteen trace layers (preferably six to eight) laminated on top of one another.

The signals from the controller, having reached the conductive traces on ring portion 52 of the flex circuit, are then routed to their destined extension members 54, each of which has a plurality of conductive copper traces thereon for allowing the signals to reach the flex circuit output contact rows or pads 56 from ring portion 52. The data signals are then electrically communicated from flex circuit output contact pads 56 of extension members 54 to the driver TAB input contact pads or rows 58. The data signals, upon reaching input contact rows 58, proceed therefrom via copper input traces to the driver chips 90 disposed on driver TABS 50. After receiving the instructional data signal from the controller, the driver chips 90 output control signals through a plurality of output leads which are connected, by way of an output contact row, to the row and column address lines of display panel 40.

By selectively energizing predetermined row and column address lines of the AMLCD panel, specific pixels in the matrix array are activated thus providing an illumination or image signal to the viewer. The address lines which are energized communicate with, for example, TFTs associated with each pixel in the array. The TFTs act as switching elements for selectively allowing a voltage to be applied across the liquid crystal material via opposing electrodes. In a normally black pixel, for example, when a voltage is applied across the liquid crystal material and radiation from the backlight 92 is directed toward the display, the liquid crystal material transmits the radiation or light therethrough allowing it to reach the viewer. Otherwise, the normally black pixel appears darkened to the viewer when a voltage less than the threshold voltage is applied across the LC material. Selective activation of specific pixels allows different images to be transmitted to the viewer. The flex circuit designs of the various embodiments of this invention may, of course, be used in conjunction with both normally white and normally black display panels (and pixels).

Figure 5:
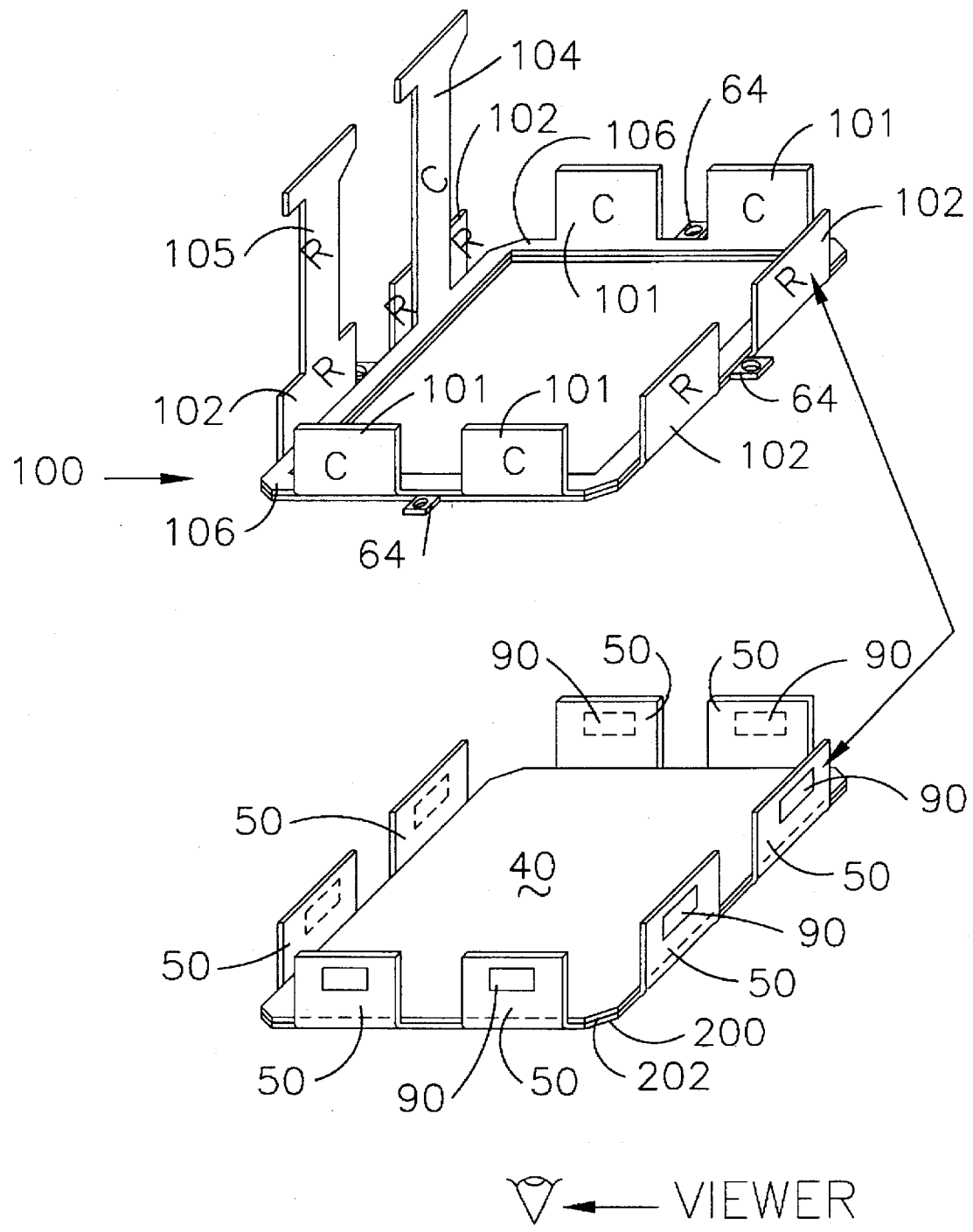
FIG. 5 is an exploded perspective view illustrating the flex circuit and the active matrix liquid crystal display panel of a second embodiment of this invention.

FIG. 5 is an exploded perspective view of a second embodiment of this invention. The principal difference between this second embodiment and the first embodiment of this invention is that the second embodiment illustrates a smaller AMLCD assembly having only eight driver TABS mounted to display panel 40.

As in the first embodiment of this invention, each driver TAB 50 is connected to the display panel 40 adjacent a peripheral side of the panel. After being connected to the front planar surface of panel 40, the flexible driver TABS 50 are bent around the periphery of panel 40 so as to extend orthogonally inward from the plane defined by the display panel. In this manner, output contact rows of the driver TABS are connected to the row and column address lines along the peripheral sides of display panel 40.

Because the AMLCD of this embodiment only requires eight driver TABS 50, flex circuit 100 is provided with just eight corresponding extension members 101, 102. The column extensions 101 of flex circuit 100 include conductive traces disposed thereon which accommodate the column data signals sent from the controller to display panel 40.

Accordingly, the row extension members 102 are provided with copper traces which transmit the row signals being sent from the controller to the display panel by way of driver TABS 50.

FIG. 5 illustrates how the flex circuit 100 includes two planar sheets ("C" and "R") laminated to one another, one sheet "C" having traces thereon for transmitting the column data and the other "R" having traces for accommodating the row data. As in the previous embodiment, each sheet includes a complete ring portion, a plurality of extensions, and a tail. As can be seen, the tail connector 104 which transmits the column addressing data is laminated over top of a row extension member 102 while the row tail connector 105 is integrally formed with one of the row extension members 102 and row sheet "R". The row and column sheets making up the flex circuit 100 are, as in the first embodiment, laminated to one another along ring portion 106 of the flex circuit. A fiberglass stiffening member (not shown) is preferably provided along the ring portion 106 (and optionally the extensions) of flex circuit 100 so as to increase its durability.

As in the first embodiment, the driver chips 90 disposed on driver TABS 50 are electrically interfaced with output contact pads (not shown) disposed on the extension members of flex circuit 100. Although not shown for purposes of simplicity, the display assembly of this embodiment is also provided with an aluminum extension receiver housing on the side of flex circuit 100 opposite the viewer. Accordingly, flex circuit 100 and display panel 40 of this embodiment are to be assembled as described above with respect to the first embodiment of this invention.

FIG. 6 is a top plan view of a flex circuit according to a third embodiment of this invention. As shown, flex circuit 120 is made up of two planer sheets laminated together, one on top of the other. In this embodiment, the bottom laminated sheet "C" includes the conductive traces for the column address lines and the top laminated sheet "R" includes the conductive traces corresponding to the row address lines. Ring portion 121 of flex circuit 120 defines a viewing area 122 through which light is selectively allowed to pass in order to display an image to the viewer. FIG. 6, unlike FIGS. 3–5, shows the flex circuit 120 before the extension members 124 and 126 are orthogonally bent with respect to ring portion 121.

A distinct difference associated with this third embodiment is the presence of four tail connectors 130–133 protruding from three different extension members 124. Flex circuit 120 requires an increased number of tail connectors due to the increased number of address lines on a corresponding high resolution AMLCD panel. Row tail connector 130 is disposed between multi-pin main connector 135 and a row extension member 124 of flex circuit 120. Tail connectors 130 and 131 interface the row address lines with the display output controller 136 while tail connectors 132 and 133 interface the column address lines of the AMLCD panel with main connector 135 and display output controller 136. Row tails 130–131 are, of course, integrally formed with their adjacent row extensions 124 while column tails 132–133 are not. Tail connectors 130 and 131 are integrally formed with row lamination sheet "R" and tail connectors 132 and 133 are integrally formed with the column lamination sheet "C", lamination of the two sheets resulting in flex circuit 120.

As can be seen by the number of column contacts 137 attached to main connector 135, flex circuit 120 of this embodiment interfaces an increased number of column address lines with the central controller 136 with respect to the first and second embodiments of this invention. Due to the need for interfacing such a high number of column address lines, column extension members 126 of flex circuit 120 each include three separate output contact rows or pads 138–140 instead of the conventional one. These output contact rows 138–140 allow the signals coming from the controller 136 to be transmitted, via an electrical solder or weld connection, to three corresponding input contact rows (not shown) on a corresponding driver TAB (not shown). See FIGS. 11–12.

While column extension members 126 have three separate contact rows 138–140 disposed thereon, row extension members 124 each have only a single laterally extending output contact row 141. The discrepancy in the number of contact rows on the row and column extension members 124 and 126 respectively, indicates that the driver chips associated with extensions 126 have greater functionality. For example, the active matrix display panel (not shown) may have a greater number of column address lines than row address lines. The result is that flex circuit 120 must interface a higher number of column address lines thereby necessitating the three separate contact rows 138–140 on each of the column extension members 126 due to the increased functionality of the column driver chips. The number of contact rows on each extension member is a function of the number of functions (e.g. # of gray levels, # of address lines, # of test, etc.) to be performed by corresponding driver chips.

This embodiment is illustrative of the fact that the number of tail connectors and contact rows associated with each flex circuit extension can be adjusted in accordance with the specific needs or size of the AMLCD panel being addressed.

FIG. 7 is a side elevational view along the ring portion of the flex circuit of the first and third embodiments of this invention. The flex circuit is made up of a row addressing sheet 150 having copper row traces thereon and a column addressing sheet 151 also having copper column traces thereon, the two sheets being laminated together at their respective ring portions to form the flex circuits of the aforesaid embodiments. Row sheet 150 and column sheet 151 form an interface 152 therebetween and may be laminated together by any conventional means (e.g. epoxy or acrylic adhesive).

FIG. 8 is a top view of a flex circuit 160 according to a fourth embodiment of this invention. Flex circuit 160 is made of a single sheet including both row and column conductive copper addressing traces 161 disposed thereon. Flex circuit 160 has a single tail connector 162 which interfaces both the row and column traces of the flex circuit with main connector 135 and controller 136. As in the previously described embodiments of this invention, ring portion 168 of flex circuit 160 has a plurality of copper traces 161 disposed thereon while the row and column extensions 166 and 164 have corresponding traces 165 laminated thereto.

Like FIG. 6, FIG. 8 illustrates flex circuit 160 in its planar form before extension members 164 and 166 are orthogonally bent with respect to ring portion 168.

As can be seen, the AMLCD panel (not shown) to be interfaced with controller 136 by flex circuit 160 of this embodiment has a greater amount of column driver chip functionality (as opposed to row chip functionality). Therefore, each column extension member 164 includes three separate output contact rows 170–172 while row extensions 166 have only one output contact row 174. As in the third embodiment, the three output contact rows 170–172 of column extension members 164 are electrically connected to three corresponding input contact rows (not shown) defined on an adjacent driver TAB (see FIGS. 11–12). This electrical connection between contact rows 170–172 of column extension members 164 and the input contact rows of the driver TABS allows the signals originating from controller 136 to be conveyed to the driver chips disposed on the driver TABS by way of flex circuit 160.

Figure 9:
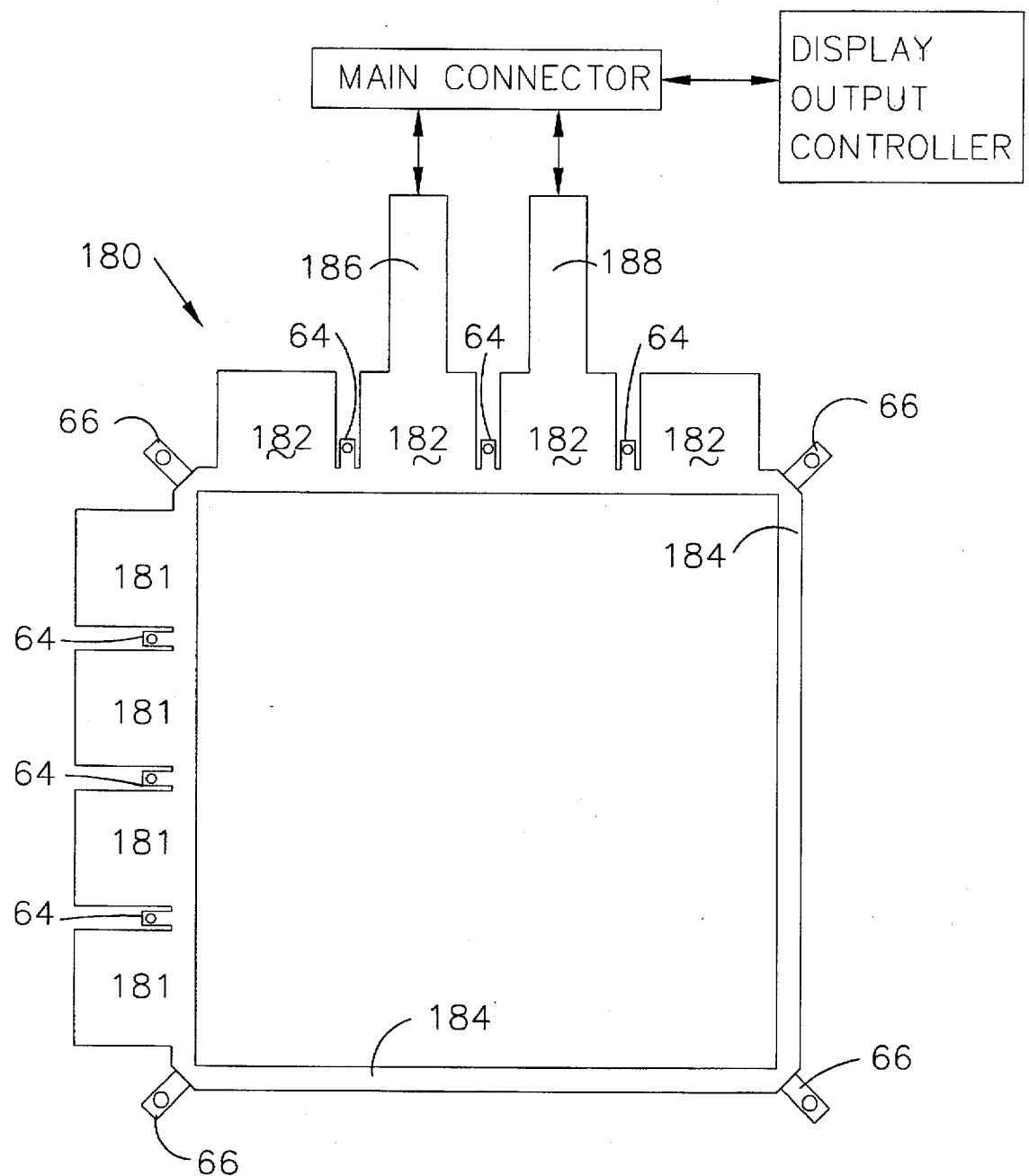
FIG. 9 is a top view of the flex circuit of a fifth embodiment of this invention, before the extensions are orthogonally bent relative to the ring portion.

FIG. 9 is a top elevational view of a flex circuit 180 according to a fifth embodiment of this invention. Flex circuit 180 consists essentially of a single sheet and is shown before extension members 181 and 182 are orthogonally bent with respect to ring portion 184. This embodiment exemplifies the adaptability of the flex circuit in that it can be designed to accommodate different types and sizes of LCDs including the type where the row and column address lines of the active matrix panel are accessible only along two adjacent peripheral sides of the display panel. Extension members 181 are to be connected to row driver TABS along one side of the display panel and column extension members 182 are to be mounted to the column driver TABS extending along an adjacent peripheral side of the display panel.

While flex circuit 180 consists essentially of only one ring-shaped flexible sheet, it is still preferably provided with a stiffener member along both ring portion 184 and extensions 181, 182. The two tail connectors 186 and 188 extend from column extensions 182. Tail 186 carries row address line data while tail 188 conveys column data. As in the other embodiments of this invention, extension members 181 and 182 of this embodiment are to be mounted in grooves of an extension receiver housing as shown and discussed above with respect to the first embodiment of this invention.

Figure 10:
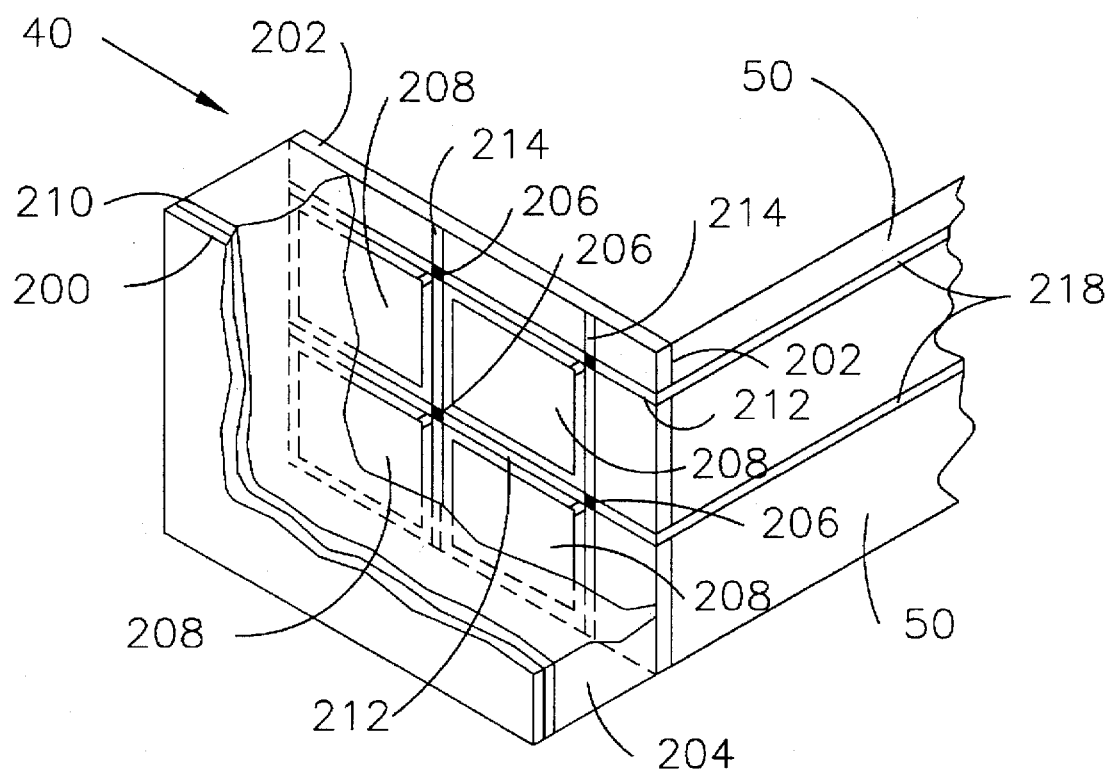
FIG. 10 is a partial cut-away view of an active matrix liquid crystal display of any of the aforesaid embodiments of this invention, including a plurality of pixels and row and column address lines electrically connected to a driver TAB.

FIG. 10 is a partial cut-away view of the liquid crystal display panel 40 of the first and second embodiments of this invention. The display panel 40 includes opposing transparent substrates 200 and 202 sandwiching a liquid crystal layer 204 therebetween. As shown, each pixel is provided with its own TFT 206 and pixel electrode 208. Display panel 40 is provided with an electrode 210 which opposes pixel electrodes 208 so as to allow a voltage to be selectively applied between electrodes 208 and 210 across the liquid crystal material 204 of each pixel. Each conventional switching TFT 206 is electrically connected to both a row address line 212 and a column address line 214.

As shown, row address lines 212 of display panel 40 are electrically connected to conductive output leads 218 disposed on driver TAB 50 in a conventional manner (not shown). For purposes of simplicity, only a small portion of display panel 40 and a corresponding row driver TAB 50 is shown in FIG. 10. As will be appreciated by those of skill in the art, display panel 40 generally includes hundreds of row and column address lines 212 and 214 arranged in an X-Y arrangement defining pixels therebetween, each address line being connected to a driver tab output lead.

Figure 11:
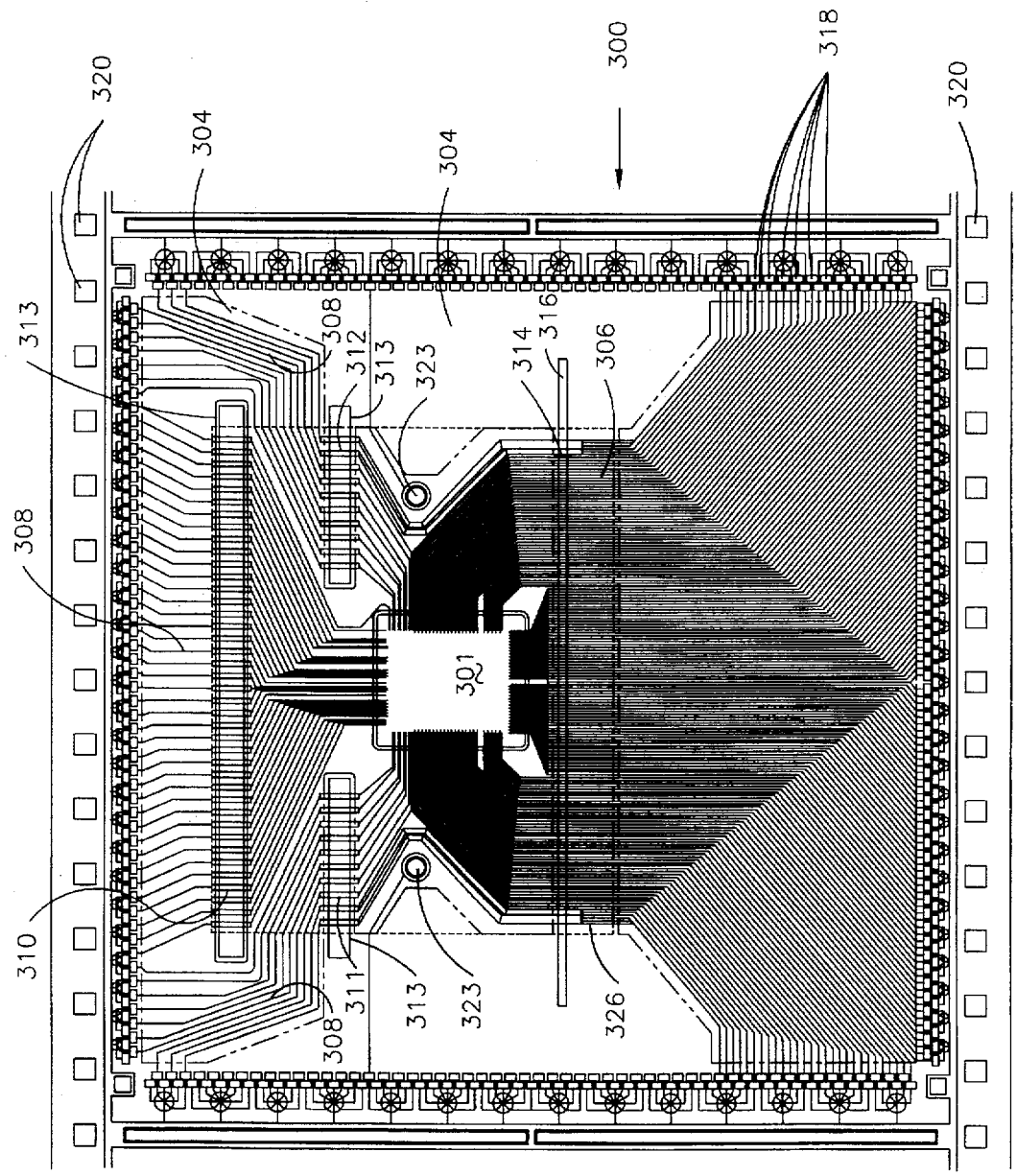
FIG. 11 is a front elevational view of a driver TAB of an embodiment of this invention before the fringes are removed therefrom, and before the output lead support portion 326 is orthogonally bent relative to base portion 304.
Figure 12:
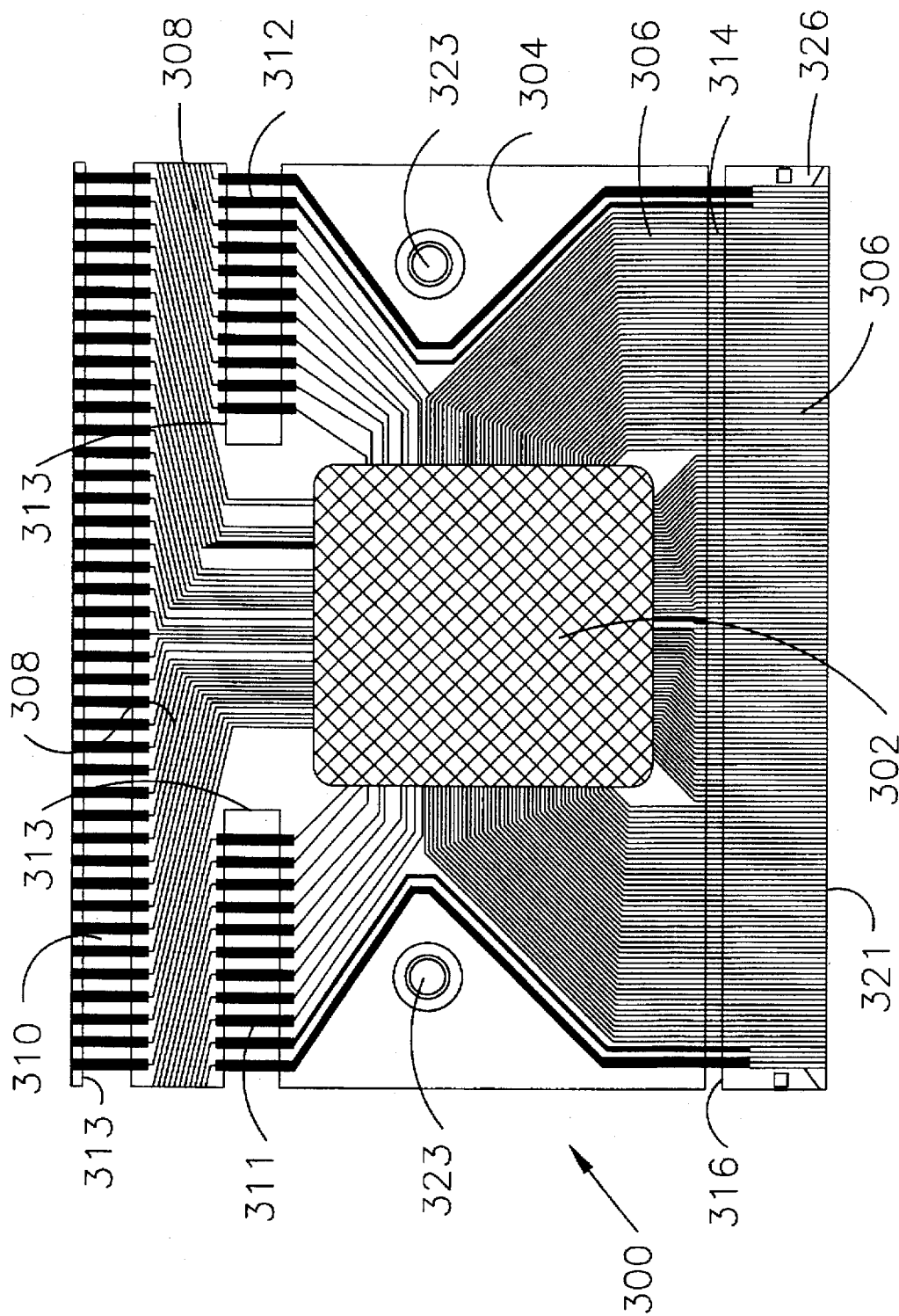
FIG. 12 is a front elevational view of the driver TAB of FIG. 11 after the fringes have been removed therefrom, but before output lead support portion 326 is orthogonally bent with respect to base portion 304.

FIGS. 11 and 12 are front elevational views of a driver TAB 300 according to an embodiment of this invention. FIG. 11 illustrates tab 300 before its fringe areas are trimmed off, while FIG. 12 shows driver TAB 300 in its pre-bent final form (after trimming) ready to be mounted on a liquid crystal display panel as described above with respect to the various embodiments of this invention.

Driver TAB 300 includes a driver chip or die 302 (see FIG. 12) adhered to base portion 304 which typically consists essentially of a polyimide (e.g. Kapton or Upilex) tape. A plurality of driver TAB output leads 306 and input traces 308 are disposed on base portion 304 of driver TAB 300. FIG. 11 illustrates TAB 300 before chip 302 is mounted thereon. Window 301 shown in FIG. 11 receives chip 302. Chip 302 is electrically connected to output and input leads 306 and 308 (traces) preferably by way of gold welds. After welding chip 302 is covered with a conventional encapsulant which seals the chip and welds attached thereto. Both the input and output leads preferably consist essentially of copper traces extending from driver chip 302 to peripheral edges of driver TAB 300.

Output lead support portion 326 is shown in FIGS 11–12 as coplanar with base portion 304. In use, support portion 326 is mounted to the front planar surface of a display panel and base portion 304 is bent orthogonally with respect thereto about window 316. Accordingly, when mounted, the output leads 306 on one side of window 316 extend at about a 90°angle with respect to the output leads 306 on the other side of window 316, output leads 306 being bent at window 316 at a location indicated by reference numeral 314.

An important characteristic of driver TAB 300 is that it defines three separate and distinct input contact rows (i.e. pads) 310, 311, and 312. The input contact rows 310–312 each include a plurality of electrical input contacts crossing over windows 313 defined by the tape or base portion 304 of the driver tab. Driver TAB 300 also includes a single output contact row or pad 306 defined by the plurality of output leads disposed on support portion 326.

The significance of the three separate input contact rows 310–312 is that they allow the manufacturer to package a greater number of contacts (and leads) within the confines of a driver TAB without significantly increasing the size of the tab or depth of the AMLCD assembly. This in turn allows a greater number of display panel address lines to be interfaced with. Just as important is the fact that the number of contacts disposed on the driver TAB can be increased without reducing the pitch of the input contacts. Accordingly, the manufacturability remains high even with a significantly higher number of electrical contacts disposed on the driver TAB.

As shown and described above with respect to various embodiments of this invention, driver tabs according to this invention may include either a conventional single input contact row, or a multiplicity of input contact rows, as in this embodiment, depending on the resolution of the AMLCD being addressed.

Driver TAB input contact rows (or pads) 311 and 312 define a longitudinal axis which is substantially parallel to the longitudinal axis defined by the larger input contact row 310. By positioning input contact rows 311 and 312 behind large contact row 310 and allowing input traces 308 from contact row 310 to pass between the gap between rows 311 and 312, the number of input contacts is significantly increased without decreasing the pitch of the contacts in the input rows.

Each input and output lead 308 (traces) and 306 disposed on driver TAB 300 before the fringe portion is trimmed therefrom is connected to a separate test pad 318 (see FIG. 11). Test pads 318 associated with each input and output lead are used to test the capabilities and functionality of the input and output leads and corresponding driver chip before the fringe portion is removed and driver tab 300 is installed. By testing driver TAB 300 via the multiplicity of test pads 318, the AMLCD manufacturer can ensure the proper functioning of each driver tab 300 before it is installed and affixed to the display panel.

Another significant advantage of the multiple input contact row driver TAB 300 is that it allows an increased number of input and output leads to be tested via test pads 318 without significantly increasing the overall size of the driver TAB. As can be seen, a portion of output leads 306, and input traces 308 extending from contact rows 311 and 312, are connected to test pads 318 extending vertically along the lateral sides (i.e. periphery) of driver TAB 300. The remaining input and output leads are connected to test pads 318 extending horizontally along the top and bottom vertical edges of the tab 300, the top and bottom vertical edges being substantially parallel to the plane defined by the display panel. Because test pads 318 are disposed on the fringe portion of driver TAB 300 as shown in FIG. 11, they are removed in the trimming process, along with sprocket holes 320, before driver TAB 300 is affixed to the display panel.

FIG. 12 is a front elevational view of driver TAB 300 after the fringe areas have been trimmed, i.e. removed. As shown, driver tab 300 is now ready for affixation adjacent a peripheral side of a display panel. Each output lead 306 is to be electrically connected to a row or column address line of the display panel in a conventional manner. Support portion 326 is mounted to the viewer side planar surface of the display panel with TAB 300 then being bent around the peripheral edge of the panel about window 316 so as to allow the main or base portion 304 of driver TAB 300 to extend orthogonally away from the planar surfaces of the display panel. This technique of driver TAB mounting allows the contacts of the output contact row to be connected to the address lines of the display panel in a conventional manner.

The input contacts of rows 310–312 are electrically connected to corresponding output contact rows or pads disposed on extension members of a flex circuit according to an embodiment of this invention. See, for example, FIGS. 6 and 8 where the input contacts defined by rows or pads 310–312 may be connected to corresponding output contacts 138–140 (or 170–172) of the flex circuit. The interfacing of such a high number of address lines with the flex circuit by a single driver TAB allows an AMLCD. of a higher resolution to be driven without significantly increasing the lateral size or vertical depth of the assembly.

The base or tape portion 304 of driver TAB 300 is preferably formed of a polyimide material while the input and output leads preferably consist essentially of copper (each being of a single layer). Tooling holes 323 are used to locate and stabilize the driver TAB during the manufacturing and fringe removal processes. Pads 310–312, and their respective window lengths, allow the contacts defined thereby to maintain a large enough pitch so they can be efficiently soldered (or gold-welded) to their corresponding output contact pads.

In a typical operation of driver TAB 300, input signals originating from a display output controller enter the confines of TAB 300 via input contact rows 310–312. The signals then proceed through input traces 308 until they reach driver chip 302. The driver chip deciphers the signals from the controller and outputs corresponding signals through output leads 306. Each output lead is connected electrically to a display address line by way of an output contact row. In this manner, the multiplicity of row and column display panel address lines are addressed and controlled by the controller by way of driver TABS 300.

The above described and illustrated elements of the various embodiments of this invention are manufactured and connected to one another by conventional methods commonly used throughout the art.

Once given the above disclosure, therefore, various other modifications, features or improvements will become apparent to the skilled artisan. Such other features, modifications and improvements are thus considered a part of this invention, the scope of which is to be determined by the following claims:

We claim:

1. A driver TAB adapted for use on the periphery of a liquid crystal display panel, the driver TAB comprising:
   a driver chip or die;
   first, second, and third windows defined in a base member of the driver TAB; and
   first, second, and third input contact rows defined over said first, second, and third windows respectively, wherein each of said contact rows is in direct communication with said driver chip or die; and
   wherein substantially all leads connecting said third contact row to said chip or die pass between said first and second contact rows.

2. The driver TAB of claim 1, wherein said driver chip or die is affixed to said base member over an opening defined in said base member.

3. The driver TAB of claim 2, wherein said first and second windows are elongated and define a common axis, and wherein a portion of said base member is located between said first and second windows.

4. The driver TAB of claim 3, wherein said third window is elongated and defines an axis parallel to and spaced from said common axis, and wherein conductive lines from said third contact row in communication with said driver chip pass between said first and second windows on said base member portion.

5. A liquid crystal display including a plurality of driver TABs as in claim 1.

6. The display of claim 5, including a liquid crystal layer and a plurality of pixels.

7. A driver TAB adapted for use in conjunction with address lines of a pixel inclusive panel, the driver TAB comprising:
   a base member;
   a driver chip or die affixed to said base member;
   first, second, or third elongated windows defined in said base member; and
   first, second, and third input contact rows, each in communication with said driver chip or die, defined over said first, second, and third windows, respectively;
   wherein said third contact row includes more contacts than each of said first and second rows and is located closer to a predetermined edge of the TAB than said first and second rows; and
   wherein substantially all conductive leads extending from said chip or die to said third contact row pass between said first and second windows.

8. The driver TAB of claim 7, wherein said driver chip or die is affixed to said base member over an opening defined therein.

9. A liquid crystal display comprising:
   a liquid crystal layer;
   a plurality of pixels defined in a display panel having row and column address lines;
   a plurality of driver TABs attached around the periphery of said display panel for interfacing said row and column address lines with a display controller, wherein a plurality of said driver TABs include first, second, and third input contact rows defined over first, second, and third windows respectively defined in a base portion of each TAB;
   each of said plurality of said driver TABs including a driver chip affixed to said base portion such that input traces are defined and connected between said chip and each of said contact rows, said traces from said third row passing between said first and second windows on said base portion, and wherein said third row has more contacts than said first and second rows;

wherein each of said TABs includes an output contact row, said chip being located between said output row and said first, second, and third input rows; and wherein said first and second windows defined in said base portion each have an open end and a closed end after a fringe area of said base portion is trimmed from the TAB.

* * * * *